(12) United States Patent
Li

(10) Patent No.: US 11,309,472 B2
(45) Date of Patent: Apr. 19, 2022

(54) MANUFACTURING METHOD FOR LED SUBSTRATE AND LED SUBSTRATE

(71) Applicant: SHENZHEN SANGSHEN E-COMMERCE CO., LTD., Shenzhen (CN)

(72) Inventor: Chenghao Li, Shenzhen (CN)

(73) Assignee: SHENZHEN SANGSHEN E-COMMERCE CO., LTD., Shenzhen (CN)

( * ) Notice: Subject to any disclaimer, the term of this patent is extended or adjusted under 35 U.S.C. 154(b) by 11 days.

(21) Appl. No.: 16/926,632

(22) Filed: Jul. 10, 2020

(65) Prior Publication Data

US 2021/0376208 A1  Dec. 2, 2021

(30) Foreign Application Priority Data

May 27, 2020 (CN) .......................... 202010459347.8

(51) Int. Cl.
*H01L 33/62* (2010.01)

(52) U.S. Cl.
CPC ...... *H01L 33/62* (2013.01); *H01L 2933/0066* (2013.01)

(58) Field of Classification Search
CPC ............ H01L 33/62; H01L 2933/0066; H01L 33/483; H01L 2933/0033
See application file for complete search history.

(56) References Cited

U.S. PATENT DOCUMENTS

| | | | | |
|---|---|---|---|---|
| 2006/0030221 A1* | 2/2006 | Hyland | .................. | H01R 24/64 439/676 |
| 2009/0159915 A1* | 6/2009 | Branchevsky | ........ | H01L 33/505 257/E33.061 |
| 2012/0025358 A1* | 2/2012 | Minotti | ............. | H01L 23/49537 257/676 |
| 2013/0063946 A1* | 3/2013 | Preuschl | ................... | F21K 9/20 362/249.02 |
| 2015/0345727 A1* | 12/2015 | Herrmann | ............. | H01L 33/486 362/382 |
| 2019/0067167 A1* | 2/2019 | Hong | ..................... | H01L 25/16 |

* cited by examiner

*Primary Examiner* — Victor A Mandala

(57) ABSTRACT

The present disclosure provides a manufacturing method for an LED substrate and the LED substrate, the manufacturing method for the LED substrate includes following steps: S1: preparing a carrier substrate, disposing riveting points on preset positions of the carrier substrate; S2: sintering conductive lines on the carrier substrate, and covering an outer periphery of each riveting point with connecting ends of the conductive lines; and S3: riveting terminal pins to the riveting points, combining the terminal pins with the carrier substrate, and forming a conductive connection between the terminal pins and the connecting ends of the conductive lines. Compared with a traditional manufacturing method of the LED substrate, in a manufacturing process, steps of silver paste spot coating, silver paste high-temperature sintering and the like are reduced.

10 Claims, 2 Drawing Sheets

MANUFACTURING METHOD FOR LED SUBSTRATE AND LED SUBSTRATE

TECHNICAL FIELD

The present disclosure relates to a field of LED technology, and in particular to a manufacturing method for an LED substrate and the LED substrate.

BACKGROUND

LED substrates are a basic structure for manufacturing LEDs, and are used for carrying and packaging LED chips to form LED products.

As shown in FIG. 1, a present LED substrate includes a carrier substrate 1, conductive lines 2 sintered on a surface of the carrier substrate 1, and terminal pins 3. The terminal pins 3 are sintering connected with the carrier substrate 1 by conductive silver paste 4. As shown in FIG. 2, steps of manufacturing the present LED substrate include substrate forming, lines sintering, molybdenum rods fixing, and silver paste high temperature sintering. That is, when the terminal pins 3 (molybdenum rods) are required to be connected, the conductive silver paste is melted by high temperature sintering, so that the conductive silver paste is melted at each connecting end of the terminal pins 3, and the terminal pins 3 are connected with the carrier substrate 1 when the conductive silver paste is cooled.

Due to characteristics of the conductive silver paste and a poor combining force of the carrier substrate (typically a sapphire substrate), the present technical structure of the LED substrate is easy to debond in a packaging process and a sealing process, thereby increasing risk of product reject ratio.

SUMMARY

The present disclosure provides a manufacturing method for an LED substrate to solve above technical problems.

The present disclosure provides the manufacturing method for the LED substrate, including following steps:
  S1: preparing a carrier substrate, and disposing riveting points on preset positions of the carrier substrate;
  S2: sintering conductive lines on the carrier substrate, and covering an outer periphery of each riveting point with connecting ends of the conductive lines; and
  S3: riveting terminal pins to the riveting points, combining the terminal pins with the carrier substrate, and forming a conductive connection between the terminal pins and the connecting ends of the conductive lines.

Furthermore, the riveting points are disposed on hollow-out holes of the carrier substrate.

Furthermore, in the S3, terminal foot claws are correspondingly disposed on a riveting end of each terminal pin, the terminal pins are riveted to a back surface of the carrier substrate by the terminal foot claws and the hollow-out holes to combine with the carrier substrate.

Furthermore, in the S1, the preset positions include a positive preset position of an LED and a negative preset position of the LED. The hollow-out holes are respectively formed on the carrier substrate corresponding to the positive preset position and the negative preset position. In the S3, the terminal pins include a positive terminal pin and a negative terminal pin, the positive terminal pin and the negative terminal pin are correspondingly riveted to the hollow-out hole in the positive preset position and the hollow-out hole in the negative preset position to form a positive electrode and a negative electrode.

Furthermore, the terminal foot claws are uniformly distributed. When the terminal foot claws are riveted to the back surface of the carrier substrate, the terminal foot claws represent a radial structure.

The present further provides an LED substrate, the LED substrate includes the carrier substrate and the terminal pins. The riveting points are formed in preset positions of the carrier substrate. The conductive lines are sintered on the carrier substrate, and the outer periphery of each riveting point is covered with the connecting ends of the conductive lines. The terminal pins are riveted to the riveting points, then the terminal pins are combined with the carrier substrate, and the conductive connection is formed between the terminal pins and the connecting ends of the conductive lines.

Furthermore, the riveting points are disposed on the hollow-out holes of the carrier substrate.

Furthermore, the terminal foot claws are correspondingly disposed on the riveting end of each terminal pin. The terminal pins are riveted to the back surface of the carrier substrate by the terminal foot claws and the hollow-out holes to combine with the carrier substrate Furthermore, the preset positions include the positive preset position of the LED and the negative preset position of the LED. The hollow-out holes are respectively formed on the carrier substrate corresponding to the positive preset position and the negative preset position. The terminal pins include the positive terminal pin and the negative terminal pin, the positive terminal pin and the negative terminal pin are correspondingly riveted to the hollow-out hole in the positive preset position and the hollow-out hole in the negative preset position to form the positive electrode and the negative electrode.

Furthermore, the terminal foot claws are uniformly distributed. When the terminal foot claws are riveted to the back surface of the carrier substrate, the terminal foot claws present the radial structure.

In the present disclosure, compared with a traditional manufacturing method of the LED substrate, in a manufacturing process, steps of silver paste spot coating, silver paste high-temperature sintering and the like are reduced, a metal pin riveting mode is adopted, so that production efficiency is greatly improved and a production labor cost is indirectly reduced. Thus, compared with the prior art, the present disclosure has advantages of process and cost. In addition, the present disclosure rivets the terminal pins to the back surface of the carrier substrate by the terminal foot claws and the hollow-out holes to combine with the carrier substrate so as to form conductive and combining effects. Compared with traditional silver paste sintering, the present disclosure provides stronger combining force so that the LED substrate does not debond in a packaging process and a sealing process, thereby decreasing a risk of product reject ratio.

BRIEF DESCRIPTION OF DRAWINGS

In order to more clearly illustrate the technical solutions of embodiments of the present disclosure or the prior art, reference is made to the accompanying drawings, which are to be used in connection with the embodiments or the prior art. In particular, it will be obvious that the drawings in the following description are merely some examples of the present disclosure, and other drawings may be obtained by those skilled in the art without creative efforts according to the structures illustrated in these drawings.

DETAILED DESCRIPTION

The technical solutions of the embodiments of the present disclosure are described clearly and completely in conjunction with the drawings of the embodiments of the present disclosure. Obviously, the described embodiments are part of the embodiments of the present disclosure, but not all of the embodiments. Based on the embodiments of the present disclosure, all other embodiments obtained by those skilled in the art without creative efforts fall within the protection scopes of the present disclosure.

"Embodiments" referred in the present disclosure means that a particular feature, structure, or characteristic described in connection with the embodiments may be included in at least one embodiment of the present disclosure. The appearances of the phrase in various places in the specification are not necessarily all referring to the same embodiment, nor are separate or alternative embodiments mutually exclusive of other embodiments. Those skilled in the art explicitly and implicitly understand that the embodiments described herein may be combined with other embodiments.

Embodiment 1

Figure 1:
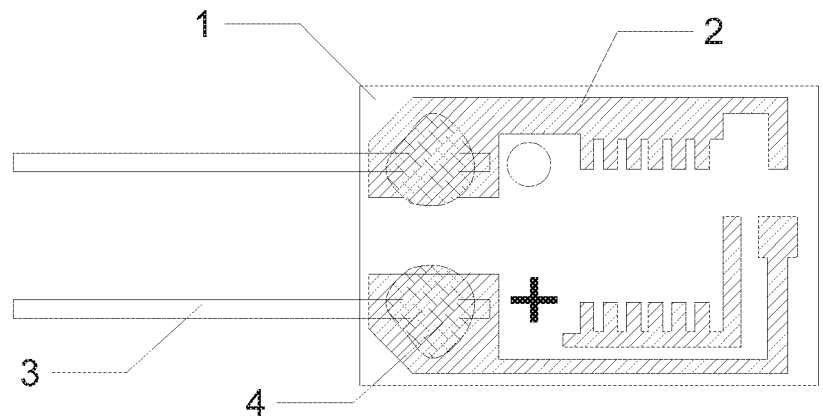
FIG. 1 is a structural schematic diagram of an LED substrate of the prior art.
Figure 2:
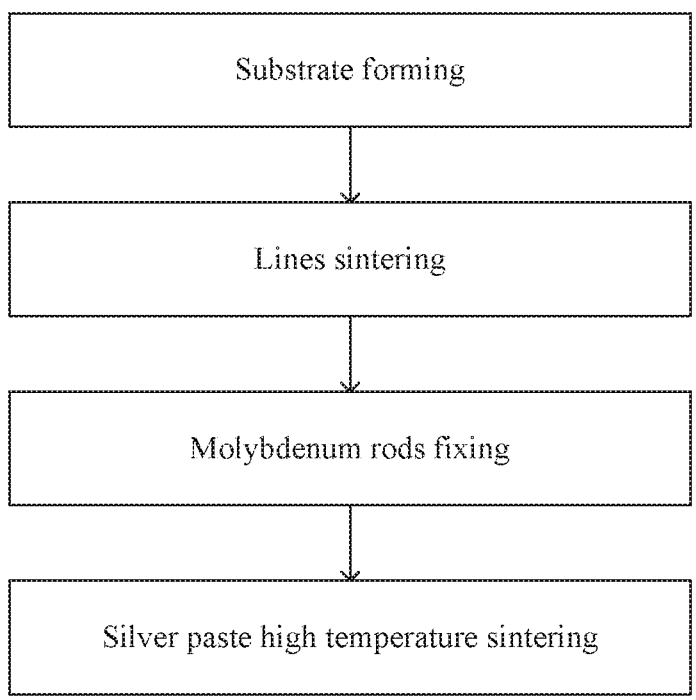
FIG. 2 is a process flowchart of the LED substrate of the prior art.
Figure 3:
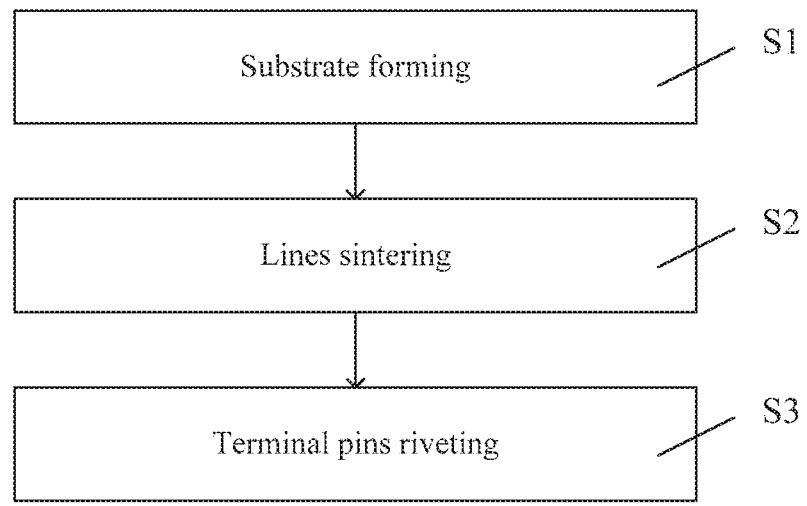
FIG. 3 is a process flowchart of a manufacturing method for an LED substrate of the present disclosure.
Figure 4:
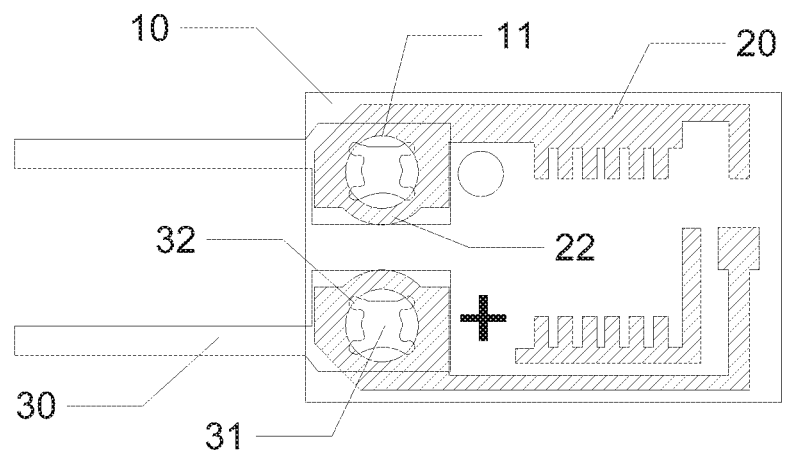
FIG. 4 is a structural schematic diagram of the manufacturing method for the LED substrate of the present disclosure.

As shown in FIG. 3, and referring to FIG. 4, the present disclosure provides a manufacturing method for an LED substrate, including following steps:

S1: preparing a carrier substrate 10, disposing riveting points on preset positions of the carrier substrate 10;

S2: sintering conductive lines 20 on the carrier substrate 10, and covering an outer periphery of each riveting point with connecting ends 22 of the conductive lines 20; and S3: riveting terminal pins 30 to the riveting points, combining the terminal pins 30 with the carrier substrate 10, and forming a conductive connection between the terminal pins 30 and the connecting ends 22 of the conductive lines 20.

In one embodiment, the riveting points adopt a structure of hollow-out holes 11, and the hollow holes are riveted in a riveting manner, which is good to riveting reliability. Absolutely, the riveting points may take other structural forms, such as bumps, pits, or other forms.

In one embodiment, a sapphire substrate is used as an example, where the sapphire substrate may be directly reserved to form hollow-out holes when the sapphire is formed, or the hollowed-out holes are machined in a subsequent machining process of the sapphire substrate. The conductive lines are formed by silver paste sintering, or copper sintering, or other alloy. The terminal pins may be of molybdenum material or other materials with good electrical conductivity.

In one embodiment, in the S3, terminal foot claws 32 are correspondingly disposed on a riveting end 31 of each terminal pin 30, the terminal pins 30 are riveted to a back surface of the carrier substrate 10 by the terminal foot claws 32 and the hollow-out holes 11 to combine with the carrier substrate 10. The terminal foot claws 32 are riveted to the back surface of the carrier substrate 10 to form an inverted connection, so that the terminal pins 30 are effectively avoided from falling off. Meanwhile, a riveting mode is adopted, so that the terminal foot claws 32 tightly fit the riveting end 31 of each terminal pin 30 on the carrier substrate 10 to make contact with the conductive lines 20 to form a reliable electrical connection.

In one embodiment, in the S1, the preset positions include a positive preset position of an LED and a negative preset position of the LED. The hollow-out holes 11 are respectively formed on the carrier substrate 10 corresponding to the positive preset position and the negative preset position. In the S3, the terminal pins 30 include a positive terminal pin and a negative terminal pin, the positive terminal pin and the negative terminal pin are correspondingly riveted to the hollow-out hole in the positive preset position and the hollow-out hole in the negative preset position to form a positive electrode and a negative electrode.

In one embodiment, the hollow-out holes 11 formed on the carrier substrate 10 are circular holes. If an effect of riveting may be achieved, the hollow-out holes 11 may also be square holes or special-shaped holes. However, the circular holes are convenient to process, and makes a contact surface of each terminal foot claw 22 more uniform during riveting.

In one embodiment, the terminal foot claws 32 are uniformly distributed. When the terminal foot claws 32 are riveted to the back surface of the carrier substrate 10, the terminal foot claws present a radial structure, which is more uniform in stress and higher in reliability.

In the present disclosure, compared with a traditional manufacturing method of the LED substrate, in a manufacturing process, steps of silver paste spot coating, silver paste high-temperature sintering and the like are reduced, a metal pin riveting mode is adopted, so that production efficiency is greatly improved and a production labor cost is indirectly reduced. Thus, compared with the prior art, the present disclosure has advantages of process and cost. In addition, the present disclosure rivets the terminal pins to the back surface of the carrier substrate by the terminal foot claws and the hollow-out holes to combine with the carrier substrate so as to form conductive and combining effects. Compared with traditional silver paste sintering, the present disclosure provides stronger combining force so that the LED substrate does not debond in a packaging process and a sealing process, thereby decreasing risk of product reject ratio.

Embodiment 2

As shown in FIG. 4, the present disclosure further provides an LED substrate. The LED substrate includes the carrier substrate 10 and the terminal pins 30.

The riveting points are formed in preset positions of the carrier substrate 10. The conductive lines 20 are sintered on the carrier substrate 10, and the outer periphery of each riveting point is covered with the connecting ends 22 of the conductive lines 20.

The terminal pins 30 are riveted to the riveting points, then the terminal pins 30 are combined with the carrier substrate 10, and the conductive connection is formed between the terminal pins 30 and the connecting ends 22 of the conductive lines 20.

In one embodiment, the riveting points adopt the structure of the hollowed-out holes 11, and the hollow holes are riveted in the riveting manner, which is good to the riveting reliability. Absolutely, the riveting points may take other structural forms, such as the bumps, the pits, or other forms.

In one embodiment, the sapphire substrate is used as the example, where the sapphire substrate may be directly reserved to form the hollow-out holes when the sapphire is formed, or the hollow-out holes are machined in the subsequent machining process of the sapphire substrate. The conductive lines are formed by silver paste sintering, or copper sintering, or other alloy. The terminal pins may be of the molybdenum material or other materials with the good electrical conductivity.

In one embodiment, terminal foot claws 32 are correspondingly disposed on the riveting end 31 of each terminal pin 30, the terminal pins 30 are riveted to the back surface of the carrier substrate 10 by the terminal foot claws 32 and the hollow-out holes 11 to combine with the carrier substrate 10. The terminal foot claws 32 are riveted to the back surface of the carrier substrate 10 to form the inverted connection, so that the terminal pins 30 are effectively avoided from falling off. Meanwhile, the riveting mode is adopted, so that the terminal foot claws 32 tightly fit the riveting end 31 of each terminal pin 30 on the carrier substrate 10 to make contact with the conductive lines 20 to form the reliable electrical connection.

In one embodiment, in the S1, the preset positions include the positive preset position of the LED and the negative preset position of the LED. The hollow-out holes 11 are respectively formed on the carrier substrate 10 corresponding to the positive preset position and the negative preset position. In the S3, the terminal pins 30 include the positive terminal pin and the negative terminal pin, the positive terminal pin and the negative terminal pin are correspondingly riveted to the hollow-out hole in the positive preset position and the hollow-out hole in the negative preset position to form the positive electrode and a negative electrode.

In one embodiment, the hollow-out holes 11 formed on the carrier substrate 10 are circular holes. If the effect of riveting may be achieved, the hollow-out holes 11 may also be square holes or special-shaped holes. However, the circular holes are convenient to process, and makes the contact surface of each terminal foot claw 22 more uniform during riveting.

In one embodiment, the terminal foot claws 32 are uniformly distributed. When the terminal foot claws 32 are riveted to the back surface of the carrier substrate 10, the terminal foot claws present a radial structure, which is more uniform in stress and higher in reliability In the present disclosure, compared with the traditional manufacturing method of the LED substrate, in the manufacturing process, the steps of silver paste spot coating, silver paste high-temperature sintering and the like are reduced, the metal pin riveting mode is adopted, so that the production efficiency is greatly improved and the production labor cost is indirectly reduced. Thus, compared with the prior art, the present disclosure has the advantages of process and cost. In addition, the present disclosure rivets the terminal pins to the back surface of the carrier substrate by the terminal foot claws and the hollow-out holes to combine with the carrier substrate so as to form the conductive and combining effects. Compared with traditional silver paste sintering, the present disclosure provides stronger combining force so that the LED substrate does not debond in the packaging process and the sealing process, thereby decreasing risk of product reject ratio.

The above disclosure is only the preferred embodiments of the present disclosure, and obviously it cannot be used to limit the scope of the present disclosure. Therefore, equivalent changes made according to the claims of the present disclosure still fall within the scope of the present disclosure.

What is claimed is:

1. A manufacturing method for an LED substrate, comprising:
    S1: preparing a carrier substrate, and disposing riveting points on preset positions of the carrier substrate;
    S2: sintering conductive lines on the carrier substrate, covering an outer periphery of each riveting point with connecting ends of the conductive lines; and
    S3: riveting terminal pins to the riveting points, and combining the terminal pins with the carrier substrate, and forming a conductive connection between the terminal pins and the connecting ends of the conductive lines.

2. The manufacturing method for the LED substrate according to claim 1, wherein the riveting points are disposed on hollow-out holes of the carrier substrate.

3. The manufacturing method for the LED substrate according to claim 2, wherein in the S3, terminal foot claws are correspondingly disposed on a riveting end of each terminal pin, the terminal pins are riveted to a back surface of the carrier substrate by the terminal foot claws and the hollow-out holes to combine with the carrier substrate.

4. The manufacturing method for the LED substrate according to claim 2, wherein in the S1, the preset positions comprise a positive preset position of an LED and a negative preset position of the LED; the hollow-out holes are respectively formed on the carrier substrate corresponding to the positive preset position and the negative preset position;
    in the S3, the terminal pins comprise a positive terminal pin and a negative terminal pin, the positive terminal pin and the negative terminal pin are correspondingly riveted to the hollow-out hole in the positive preset position and the hollow-out hole in the negative preset position to form a positive electrode and a negative electrode.

5. The manufacturing method for the LED substrate according to claim 3, wherein the terminal foot claws are uniformly distributed; when the terminal foot claws are riveted to the back surface of the carrier substrate, the terminal foot claws present a radial structure.

6. An LED substrate, comprising a carrier substrate and terminal pins; wherein riveting points are disposed on preset positions of the carrier substrate; conductive lines are sintered on the carrier substrate, and an outer periphery of each riveting point is covered with connecting ends of the conductive lines; the terminal pins are riveted to the riveting points, then the terminal pins are combined with the carrier substrate, and a conductive connection is formed between the terminal pins and the connecting ends of the conductive lines.

7. The LED substrate according to claim 6, wherein the riveting points are disposed on hollow-out holes of the carrier substrate.

8. The LED substrate according to claim 7, wherein terminal foot claws are correspondingly disposed on a riveting end of each terminal pin, the terminal pins are riveted to a back surface of the carrier substrate by the terminal foot claws and the hollow-out holes to combine with the carrier substrate.

9. The LED substrate according to claim 7, wherein the preset positions comprise a positive preset position of an LED and a negative preset position of the LED; the hollow-out holes are respectively formed on the carrier substrate corresponding to the positive preset position and the negative preset position; the terminal pins comprise a positive terminal pin and a negative terminal pin, the positive terminal pin and the negative terminal pin are correspondingly riveted to the hollow-out hole in the positive preset position and the hollow-out hole in the negative preset position to form a positive electrode and a negative electrode.

10. The LED substrate according to claim 8, wherein the terminal foot claws are uniformly distributed; when the terminal foot claws are riveted to the back surface of the carrier substrate, the terminal foot claws present a radial structure.

* * * * *